United States Patent
Troia et al.

(10) Patent No.: US 11,710,532 B2
(45) Date of Patent: Jul. 25, 2023

(54) SAFETY AND CORRECTNESS DATA READING IN NON-VOLATILE MEMORY DEVICES

(71) Applicant: Micron Technology, Inc., Boise, ID (US)

(72) Inventors: Alberto Troia, Munich (DE); Antonino Mondello, Messina (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/849,398

(22) Filed: Jun. 24, 2022

(65) Prior Publication Data

US 2022/0319626 A1 Oct. 6, 2022

Related U.S. Application Data

(63) Continuation of application No. 16/624,347, filed as application No. PCT/IB2019/000482 on May 31, 2019, now Pat. No. 11,373,724.

(51) Int. Cl.
*G11C 29/42* (2006.01)
*G11C 29/12* (2006.01)
*G11C 29/24* (2006.01)
*G11C 29/44* (2006.01)

(52) U.S. Cl.
CPC ........ *G11C 29/42* (2013.01); *G11C 29/12015* (2013.01); *G11C 29/24* (2013.01); *G11C 29/4401* (2013.01)

(58) Field of Classification Search
CPC ... G11C 29/42; G11C 29/12015; G11C 29/24; G11C 29/4401
See application file for complete search history.

(56) References Cited

U.S. PATENT DOCUMENTS

| | | | |
|---|---|---|---|
| 6,208,570 B1 | 3/2001 | Brown | |
| 6,889,307 B1 | 5/2005 | Scheuerlein | |
| 7,559,004 B1 | 7/2009 | Chang | |
| 2008/0294935 A1 | 11/2008 | Ni et al. | |
| 2012/0216094 A1* | 8/2012 | Yoo | G06F 11/1068 714/E11.03 |
| 2016/0342494 A1 | 11/2016 | Yang et al. | |
| 2017/0278574 A1 | 9/2017 | Park | |
| 2019/0065397 A1 | 2/2019 | Troia | |

OTHER PUBLICATIONS

International Search Report and Written Opinion from related international application No. PCT/IB2019/000482, dated Mar. 2, 2020, 11 pages.

* cited by examiner

*Primary Examiner* — Han Yang
(74) *Attorney, Agent, or Firm* — Brooks, Cameron & Huebsch, PLLC

(57) ABSTRACT

The present disclosure includes systems, apparatuses, and methods for improving safety and correctness of data reading in flash memory devices associated with System-on-Chips. An example may include a plurality of sub-arrays, a plurality of memory blocks in each sub-array of the plurality of sub-arrays, a plurality of memory rows in each memory block of the plurality of memory blocks, and a plurality of extended pages in each memory row of the plurality of memory rows, wherein each extended page of the plurality of extended pages includes a group of data, an address, and an error correction code (ECC).

20 Claims, 7 Drawing Sheets

SAFETY AND CORRECTNESS DATA READING IN NON-VOLATILE MEMORY DEVICES

PRIORITY INFORMATION

This application is a Continuation of U.S. application Ser. No. 16/624,347, filed on Dec. 19, 2019, which is a National Stage Application under 35 U.S.C § 371 of International Application Number PCT/IB2019/000482, filed May 31, 2019, the entire contents of which are incorporated herein by reference.

TECHNICAL FIELD

The present disclosure relates generally to memory devices and a more particularly to embodiments relating to safety and improved performances of data reading in non-volatile memory device.

BACKGROUND

Memory devices are well known in the electronic field to store and allow accessing to digital information. In general, different kind of semiconductor memory devices may be incorporated into more complex systems including either non-volatile memory components as well as volatile memory components, for instance in so-called System-on-Chips (SoC) wherein the above-mentioned memory components are embedded.

Nowadays, however, the need of Real Time Operative Systems, in particular for automotive applications requires SoC with more and more increased performances and efficiency and the known solutions no longer satisfy these requirements particularly in terms of safety. Non-volatile memory can provide persistent data by retaining stored data when not powered and can include NAND flash memory, NOR flash memory, 3D XPoint memories, MRAMs, STTRAM and CBRAMs, among others. NAND flash has reduced erase and write times, and requires less chip area per cell, thus allowing greater storage density and lower cost per bit than NOR flash. However, the I/O interface of NAND flash does not provide a random-access external address bus. Rather, data must be read on a block-wise basis, with typical block sizes of hundreds to thousands of bits.

Flash memory devices suffer temperature variation, in particular the increase of the temperature during their functioning. The reason is mainly due to the fact that when the floating gates forming the memory is biased in presence of a higher temperature may reach an energy level sufficient to allow a jump into the channel and the consequence is a charge lost. In other technologies using for instance charge traps, the high temperature accelerates the recombination and this means losing the stored info. These problems affect the safety and correctness of the data read from the memory device.

Moreover, in automotive applications, interactions between the human body and electrical/electronic systems are increasing significantly, specifically when managing safety-critical decisions that can have a severe impact on a driver's health. As the evolution of these advanced safety systems moves from passive to more active, including predictive safety and even autonomous vehicle concepts, the automotive industry has and will continue to demand that strict requirements be met even for passengers, pedestrians and the other operators on the roads.

Managing these safety-critical decisions is trending toward increased complexity and additional software content in safety systems. With greater complexity, there are increasing risks of systematic and/or random hardware failures.

There is a need of providing a Flash memory device associated to a SoC device offering improved safety and correctness data reading thus reducing the risk of malfunctions.

DETAILED DESCRIPTION

Figure 1:
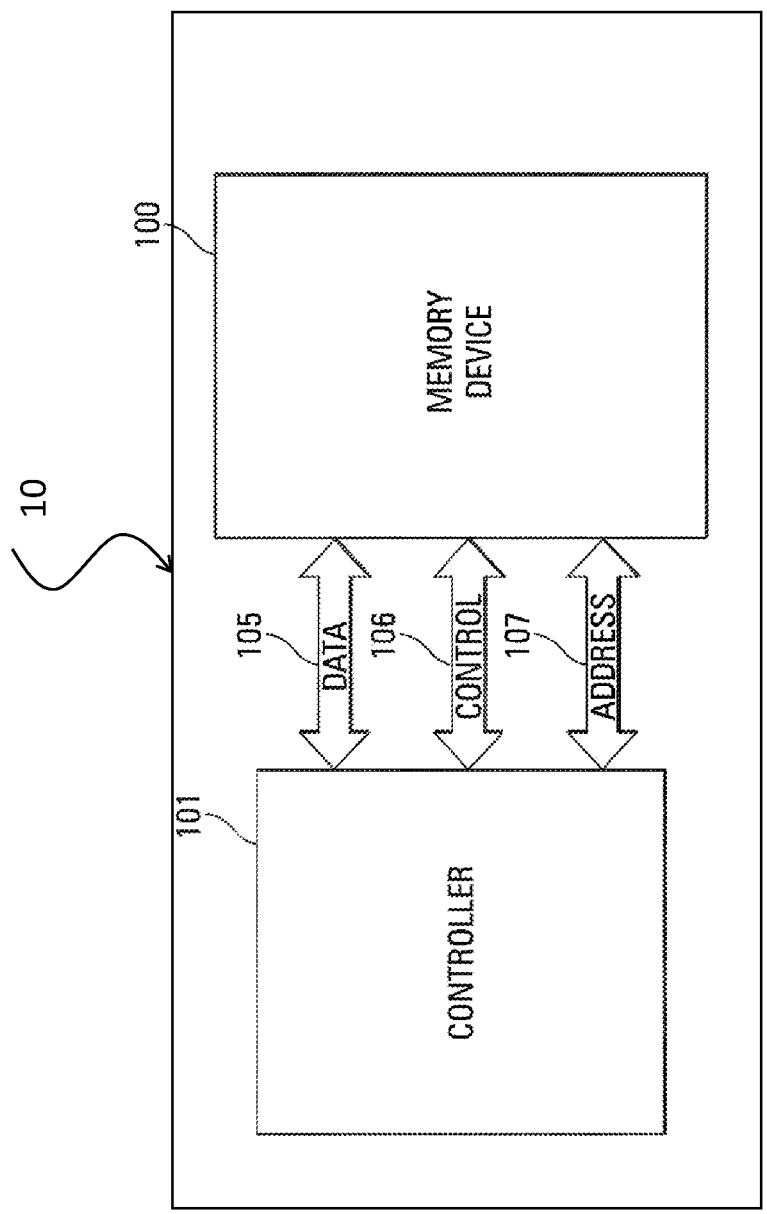
FIG. 1 shows a schematic view of a system including a memory component associated to a controller exchanging data, address and control signals with the memory device.

Several embodiments of the present disclosure are directed to memory devices, systems including memory devices or components and methods of operating memory devices or components avoiding the potential problems of aging, temperature and process drift during memory operation.

In one embodiment of the present disclosure a new memory architecture is provided for an improved safety and performances of the data reading phase in the non-volatile memory device.

In the following detailed description, reference is made to the accompanying drawings that form a part thereof and in which is shown, by way of illustration, specific embodiments. In the drawings, like numerals describe substantially similar components throughout the several views. Other embodiments may be disclosed and structural, logical, and electrical changes may be made without departing from the scope of the present disclosure. The following detailed description is, therefore, not to be taken in a limiting sense.

When a memory array is addressed, there may be one or more layers of address translation, for instance a translation between a logical address used by a host device and a physical address corresponding to a location in the memory array. Changes in threshold voltage of the cells, through programming of a charge storage structure, such as floating gates or trapping layers or other physical phenomena, determine the data state of each cell.

Moreover, it may happen that temperature variations inside a same device may generate reading drifts called ghost temperature issue.

The drawback connected to such temperature variations has an impact on the real bit distribution that is detected by the sense amplifiers as moved with respect to the ideal central value for which they have been programmed.

Just to give a practical example, if the programming phase has been performed at −40° C., it may happen that at 120° C. the reading results include many errors. This is a real issue for all chips incorporated into automotive devices wherein a raising of the temperature during the operation of a vehicle must be taken in consideration; moreover, a raise in temperature moves or enlarges either the distribution of the well erased/programmed cells to the left and/or to the right (e.g., to lower and/or higher threshold voltage).

Therefore, the reading phase of the memory device is most of the times performed in environments conditions similar to the original programming phase; this is true also for the erasing phase.

Moreover, the drift due to temperature is further increased by the age and intense usage (e.g., in terms of write/erase cycles) of the device and this problem could be particularly delicate for memory devices incorporated into System-on-Chip driving autonomous vehicles.

FIG. 1 illustrates a schematic example of a system 10 incorporating a flash memory device 100. The system also includes a memory controller 101 that is coupled to the memory device 100.

The controller 101 is shown coupled to the memory device 100 over a data bus 105, a control bus 106, and an address bus 107. In one embodiment, the data bus could be a 64 bit and/or 128 bit wide double data rate (DDR) bus.

More specifically, with reference to FIG. 2, the non-volatile memory component or device 100 includes an array 90 of Flash memory cells and a circuitry located around the memory array, as described in more detail below. The coupling between the SoC structure 10 and the memory component 100 is obtained by interconnecting a plurality of respective pads or pin terminals that are faced one toward the other in a circuit layout that keeps the alignment of the pads even if the size of the memory component is modified.

In one embodiment of the present disclosure, the arrangement of the pads of the memory component has been realized on a surface of the memory component 100, in practice on the top of the array. More specifically, the pads are arranged over the array so that, when the memory component 100 is reversed or flipped, its pads are faced to corresponding pads of the host or SoC structure 10.

The memory component 100 is manufactured according to the user's needs in a range of values that may vary according to the available technology, for instance from at least 128 Mbit to 512 Mbit or even more without any limitation for the applicant's rights. More specifically, the proposed external architecture allows to overpass the limit of the current eFlash (i.e. embedded flash technology) allowing the integration of bigger memory, as it can be 512 Mbit and/or 1 Gbit and/or more depending on the memory technology and technology node.

The final configuration will be a face-to-face interconnection SoC/Flash Array with the sense amplifiers connected to the SoC in a Direct Memory Access configuration for user modes with high frequency accesses.

The Direct Memory Access allows reducing the final latency that the SoC can experience when reading the data. Moreover, the final latency is also reduced by the block form factor, the sense amplifiers distribution between blocks, the selection of the comparison threshold in the sense amplifiers and the optimized path.

For a better understanding of the principle of the present disclosure it should be noted that a direct memory access is a feature of computing systems that allows certain hardware subsystems to access main system memory (generally volatile such as random-access memory), independent of the CPU (Central Processing Unit).

More Specifically, DMA is used when the CPU is using memory and it is typically occupied for some clock cycle of the read or write operation. Thus, whenever the I/O devices access the memory it takes a lot of time to get the data in and/or out of the memory.

The I/O devices first initiates the transfer using DMA Controller, relinquishing the control of buses from the CPU, and then CPU does other operations while the transfer is in progress, and it finally receives an interrupt from the DMA controller when the operation is done, hence address or data buses can now be used by it for its internal operations. This feature is useful at any time that the CPU cannot keep up with the rate of data transfer, or when the CPU needs to perform work while waiting for a relatively slow I/O (Input or Output) data transfer. Many hardware systems use DMA, including disk drive controllers, graphics cards, network cards and sound cards.

DMA is used according to the present disclosure for intra-system data transfer in multi-core processors. The cores that have DMA channels can transfer data to and from the memory components with much less CPU overhead than cores without DMA channels. Similarly, a processing element inside a multi-core processor can transfer data to and from its local memory without occupying its processor time, allowing computation and data transfer to proceed in parallel.

The direct memory access of the present disclosure employs boundary scan cells and sense amplifiers as a system and method for addressing direct memory access operation and locating the memory address to a specific DMA flash array. In this respect, a modified JTAG cell structure is implemented to allow enlarging the memory pages to be read in a direct access.

Figure 2:
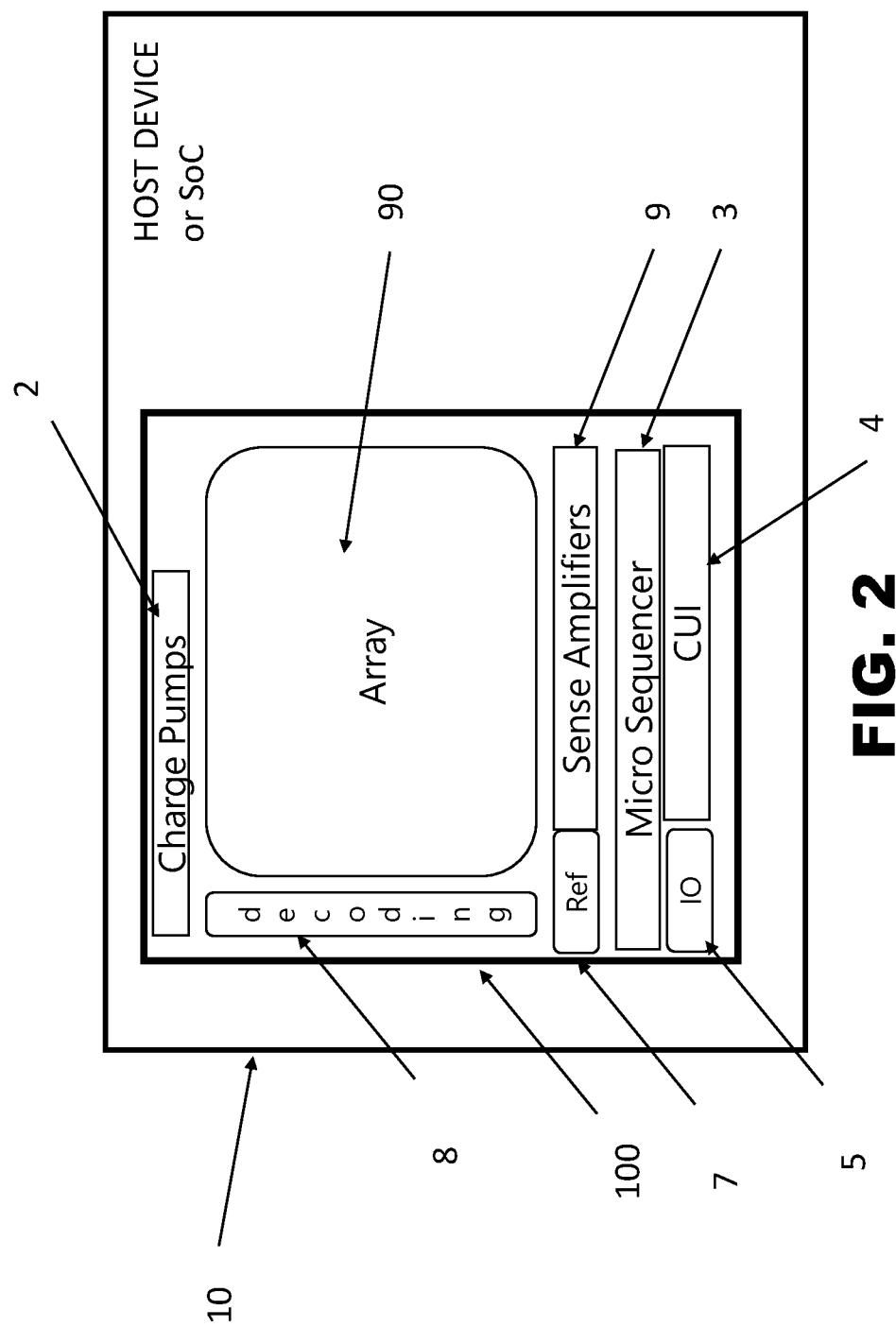
FIG. 2 is a schematic view of the memory component according to the present disclosure.

With more specific reference to the example of FIG. 2, the main structure of the memory component 100 according to an embodiment of the present disclosure will be disclosed.

The memory component 100 includes at least: an I/O circuit 5, a micro-sequencer 3, an array of memory cells 90, voltage and current reference generators 7, charge pumps 2 and decoding circuitry 8 located at the array periphery or below the array, sense amplifiers 9 and corresponding latches, a command user interface, for instance a CUI block 4.

The array of memory cells 90 includes non-volatile Flash memory cells. The cells can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages and timing on the access and data lines.

To write and erase the memory cells of the Array 90 it is provided a dedicated logic circuit portion including a simplified Reduced Instruction Set Computer (RISC) controller or a Modify Finite State Machine or that is the logic circuit for handling the programming and erasing algorithms.

To read the memory cells of the array 90 it is provided a dedicated circuit portion including an optimized Read Finite State Machine or RISC that is used to ensure high read performance, such as: branch prediction, fetch/pre-fetch, interrupt management, and so on. The error correction is left, as operation, to the SoC 10; the additional bits are provided to the controller 101 to store any possible ECC syndrome associated with the page. The ECC cells allows the host controller to understand if corruption is happening in the data plus address content. The ECC allows the host also to correct the received data. the host is responsible to fix the data in the memory based on the correction made in the received data.

The writing and erasing phases above reported are handled by the memory controller located inside the memory device, since the internal flash controller does not work in read operations that are driven by the host.

Figure 3:
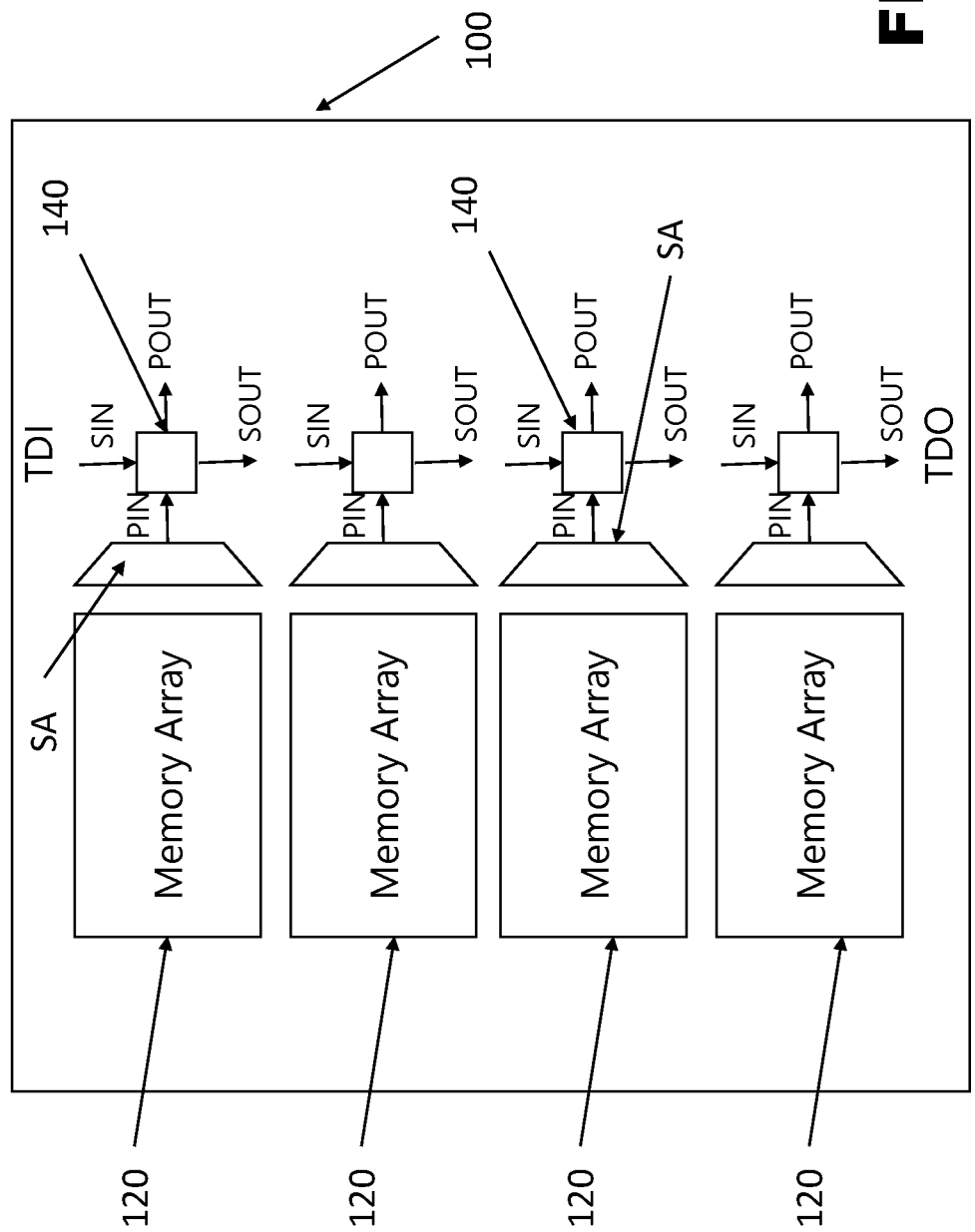
FIG. 3 is a schematic layout view of an example of the memory component according to embodiments of the present disclosure.

Making now more specific reference to the example of FIG. 3, in one embodiment of the present disclosure the memory array 90 is built as a collection of sub arrays 120. In this manner, having smaller sectors if compared to known solutions the access time is significantly reduced and the whole throughput of the memory component is improved.

This architecture is very scalable and expanding and/or reducing the density of the final device translated only in mirroring a sub-array and generating the connection.

The host device or the System-on-Chip 10 normally includes more than one core and each core is coupled to a corresponding bus or channel for receiving and transferring data to the memory component 1. Each sub-array 120 has access to a corresponding channel to communicate with a corresponding core of the System-on-Chip.

The core of the host device can have access to a JTAG interface by using some internal pads. Such pads are high speed and have the capability to support the maximum frequency. Such pads however cannot manage analog voltage outside the flash array.

In embodiments of the present disclosure a Direct Memory Access (DMA) allows to reduce the final latency that the SoC can experience when reading the data.

To overcome the problems of flash memory devices embedded in System-on-Chips and obtaining a very low initial latency and high throughput, it has been designed a scalable, low-cost, effective and reliable memory apparatus and method involving completion of read operation with data, address and ECC by DMA flash array, ensuring that the data must be read from exactly the same memory location as the controller is asking for.

Coming now to a closer look to the internal structure of the memory component 100 it should be noted that the architecture of the array 90 is built as a collection of sub arrays 120, as shown schematically in FIG. 3.

Figure 4:
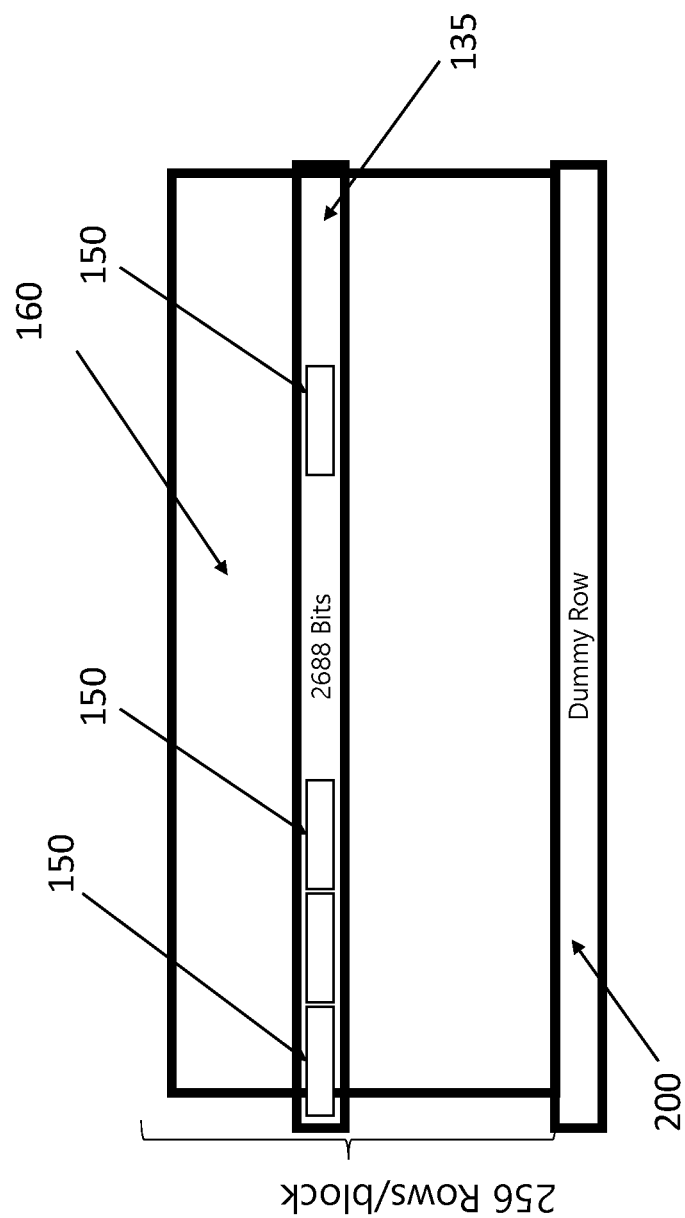
FIG. 4 is a schematic view of a memory block formed by a plurality of rows of the memory array according to one embodiment of the present disclosure.

Each sub array 120 is independently addressable inside the memory device 100. Each sub-array 120 contains multiple memory blocks 160, as depicted in FIGS. 3 and 4.

In this manner, having smaller sectors if compared to known solutions the access time is significantly reduced and the whole throughput of the memory component is improved. The reduction of the initial latency time is at block level because the row and column lines, the read path associated latency and the external communication have been optimized.

In the embodiments disclosed herewith the memory array 90 is structured with a number of sub-arrays 120 at least corresponding to the number of cores of the associated SoC 10 and, therefore to the number of corresponding communication channels. For instance, at least four memory sub arrays 120 one for each communication channel with a corresponding core of the SoC 10 are provided.

The host device or the System-on-Chip 10 normally includes more than one core and each core is coupled to a corresponding bus or channel for receiving and transferring data to the memory component 100.

Therefore, in the present implementation each sub-array 120 has access to a corresponding channel to communicate with a corresponding core of the System-on-Chip 10. The outcome of the memory blocks is driven directly to the SoC without using high power output buffers and optimizing the path.

This architecture is very scalable, wherein expanding and/or reducing the density of the final device translates only in mirroring a sub-array and generating the connection or increasing the number of blocks of each subarray, that is the available density per core.

It should be further noted that each subarray 120 includes address registers connected to data buffer registers, similarly to an architecture used in a DRAM memory device.

Moreover, in one embodiment of the present disclosure each memory sub array 120 is structured in memory blocks 160 shown schematically in FIG. 4.

Each independently addressable location of the blocks of each memory sub array 90 addresses an extended page 150. Later, a couple of extended pages will be defined with the term "super page".

Said differently, the atomic page of 128 bits used in each sub-array 120 to fill the communication channel with the SoC device has been enlarged in the present implementation to contain the stored address and the ECC.

As non-limiting example, this extended page 150 comprises a string including a first group of at least N Bits, for instance one-hundred-twenty-eight (128) Bit for the I/O data exchange with the SoC device 10 plus at least a second group of M Bits, for instance twenty-four (24) address Bit and a final or third group of at least R Bits, for instance sixteen (16) ECC Bit. The M address Bit (in the example the twenty-four address Bits) are sufficient to address up to 2GigaBit of available memory space.

According to the present disclosure, the outputs of the sense amplifiers SA prepare a double extended page at a time, i.e. a super-page 150 comprising a number of Bits given by the double combination of the above-mentioned three groups of data bits, address bits and ECC bits, according to the size of the memory array.

In the specific but non-limiting example disclosed herewith each extended page 150 includes at least 168 Bit obtained by the combination of the above three groups of N+M+R=128+24+16 data, address and ECC Bit and each super-page is formed by a couple of extended pages, i.e. a group of 168×2 Bits.

Just to give a non-limiting numeric example, each row of a memory block 160 includes sixteen extended pages. Therefore, the resulting row includes 2688 Bit coming out from the combination of sixteen extended pages independently addressable and each including 168 Bit or, said differently, the combination of eight super-pages.

A first embodiment of the present disclosure relates to a non-volatile memory device including at least an array of memory cells with associated decoding and sensing circuitry and a memory controller, wherein the memory array comprises:

a plurality of sub-arrays in said at least an array;
a plurality of memory blocks in each sub-array;
a plurality of memory rows in each memory block;
a plurality of extended pages in each memory row, each
  extended page including a group of data, address and
  ECC Bit to improve the safety of the data reading.

Another embodiment of the present disclosure relates to a method for improving the safety and correctness of data reading in a memory device associated to a host device or System-on-chip and including a memory array of memory cells, comprising:

storing data in data memory cells;

storing memory address in first memory cells of a spare area;

storing ECC in second memory cells of the spare area;

comparing a content of the first memory cells with an address of a requested data.

Figure 5:
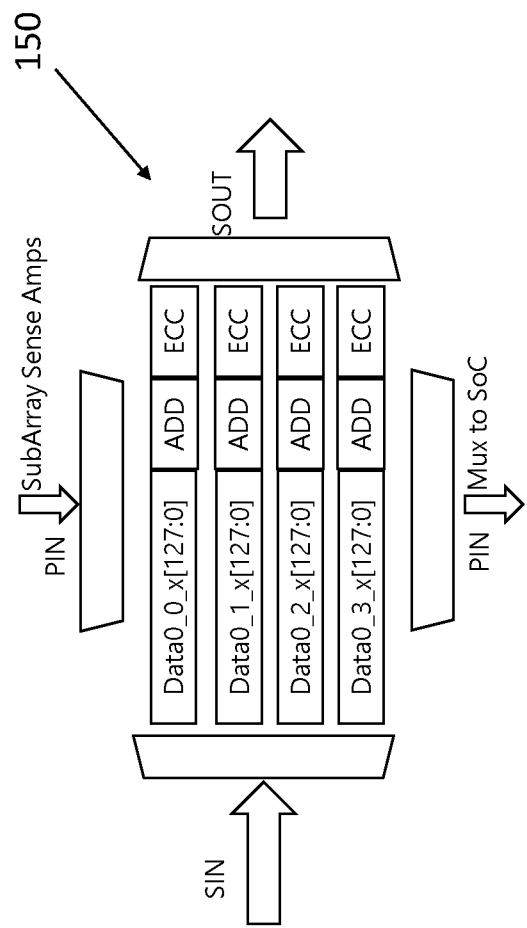
FIG. 5 is a schematic view of a group of address registers for a memory page in the memory component of the present disclosure.
Figure 6:
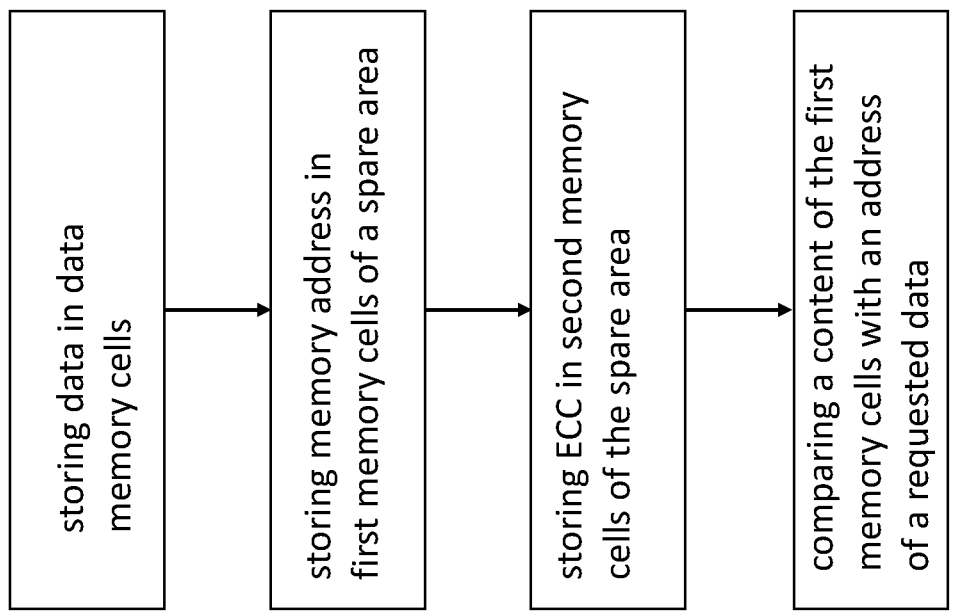
FIG. 6 is a block diagram illustrating phases of a method for improving the safety of the data reading in non-volatile memory device of the present disclosure.

FIG. 6 is a block diagram illustrating phases of a method for improving the safety of the data reading in non-volatile memory device of the present disclosure according to the method described above. The method may be carried out by the memory device or component further described in detail with reference to FIGS. 1 to 5.

A further embodiment of the present disclosure relates to a method for improving the safety of the data reading in an independent memory device including an array of memory cells and coupled to a SoC through a communication channel, the method comprising:

defining an extended memory page including data Bits, address Bits and ECC bits;

reading said extended memory page in the SoC;

comparing in the SoC the address Bits of the extended page read during the reading with requested address bits to verify correctness of a location of the data Bits.

Figure 7:
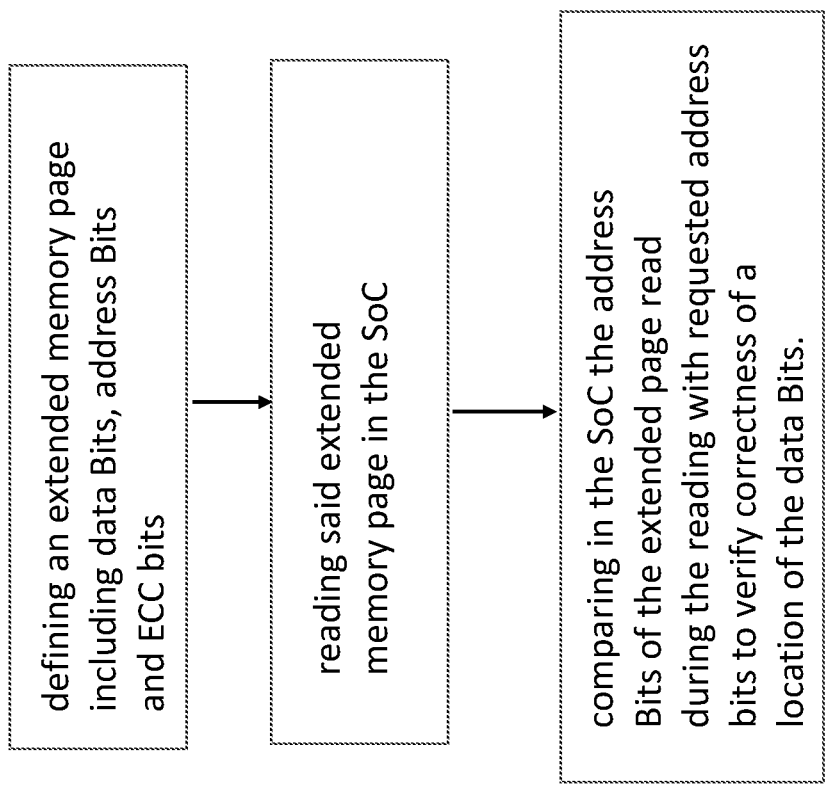
FIG. 7 is another block diagram illustrating phases of a method for improving the safety of the data reading in non-volatile memory device of the present disclosure.

FIG. 7 is a block diagram illustrating phases of a method for improving the safety of the data reading in non-volatile memory device of the present disclosure according to the method described above. The method may be carried out by the memory device or component further described in detail with reference to FIGS. 1 to 5.

According to one embodiment of the present disclosure, as shown in FIG. 4, at least a dummy row 200 is associated to each block 160 of the memory sub array 120.

This dummy row 200 is located outside the address space of the memory array 90 and is used for the optimization of the read, write and erase parameters. Moreover, this dummy row is used for erase robustness monitor, for good completion of modify operations and others purpose.

According to another embodiment, the dummy row of a block 160 is provided in another block of the memory sub-array 120.

The presence of this dummy row allows storing the read parameters in a proper time and manner to use the monitor operation to optimize the further steps.

Therefore, a main purpose of this dummy row 200 is that of tracking parameters that may be used during the read and erase phases of the memory component 100 and/or to store some parameters for discovering a possible occurred power loss.

The dummy row 200 contains a pattern that is known to the controller 101 of the memory device 100.

Each memory block contains at least 256 rows and each row includes sixteen extended pages of the above size. Each extended page includes at least 168 Bits as a combination of data, addressing and ECC Bits. Therefore, each row of the memory array can contain up to sixteen double words of 32 bits each, plus the address and ECC bits per page.

Just to give a numeric value, an extended page is formed by 128+16+24=168 Bits and sixteen extended pages per each row comprise 168*16=2688 bits.

Therefore, each row 135 of a memory block 160 includes at least sixteen pages comprising a memory word plus the corresponding address Bits and the corresponding ECC Bits or, said differently, the combination of eight extended pages.

Obviously, another size can be selected and the reported value are just for illustration purpose of a non-limiting example. The outcome of the blocks is driven directly by the host device or SoC 10 without using high power output buffers of the known solutions and optimizing the path thanks a modified and optimized JTAG interface.

The outputs of the sense amplifiers SA per sub array 120 are latched by an internal circuit of a read interface. The memory structure can be expanded to allow multi-page read while shifting out the already read page.

The sense amplifiers SA are connected directly to a modified JTAG cells, that will be later disclosed, so to integrate a JTAG structure and the sense amplifiers in a single circuit portion. This allows reducing as much as possible the delay in propagating the output of the memory array to the SoC.

As previously said, the internal sense amplifiers 9 are preparing two pages of at least 128 bits plus address and ECC Bits for a total of 168 Bits and while the first page is ready to be shifted, internally it is performed a further read operation of a second page associated with the same address.

This allows to prepare from five to eight double word, that are typical in the RTOS application allowing the sense amplifiers to execute a further internal read operation to prepare the second nibble or group of 168 Bits, if the system is structured with two pages of 168 Bits. This is the reason for having chosen a double page of 2×128 bits plus corresponding addresses and ECC Bits.

This second part of four double words is transferred to the output of the flash array 90, using an additional enabling signal (i.e. an internal clock signal or an ADV signal) that transfers the content read at sense amplifier level to the host device or SoC device 10. The signal names are load_data [0, 1] . . . there is no need of incrementing the address when using the super page.

The combined string of data cells+address cells+ECC cells allows to implement the whole safety coverage of the communication channel according to the standard requirements of the rule ISO26262, because the host first corrects the data stream, if any, and then compares the sent address with the received one.

Moreover, the ECC covers the whole bus communication (data cells+address cells), while the presence of the address cells provides the confidence that the data is coming exactly from the addressed location of the controller, i.e. if ADD==ADD0.

A JTAG interface is adopted for the test of the memory component allowing the re-use of the testing tooling. The memory component of the present disclosure also comprises a JTAG logic including a JTAG interface.

In more details, each memory array includes at least a JTAG interface receiving as inputs standard JTAG signals: TMS, TCK, TDI as well as data from a memory page, for instance the page schematically shown in FIG. 5. According to embodiments of the present disclosure, a flexible TDI signal is used. The flexibility is due to the fact that the number of parallel bits working as TDI are depending from a selected registers, i.e. the instruction register, the address register or the data register, etc.

This JTAG interface produce as output data, addresses and control signals that are transferred to a memory address decoder and also to the internal flash controller to perform modify, testing, verification operations.

The above features are of particular importance for Real Time Operative Systems for automotive applications wherein it is required to have SoC with more and more increased performances in the exchange of data with the memory array.

With the greater complexity of these SoC devices there are increasing risks of systematic and/or random hardware failures. To help ensure the highest safety standards and influence the development of safe automotive systems, the industry has released the latest above-mentioned automotive safety standard: ISO 26262

In this respect, the solution proposed in the present disclosure achieves a safety target required by the Automotive Safety Integrity Level (ASIL) of the original equipment manufacturer (OEM). The level status achieved by the solution disclosed herewith is at least a level ASIL-D Thanks to the previously disclosed hardware solution, the memory device of the present disclosure is implementing a methodology to allow the SoC to understand that data content is read from exactly the address that the controller is asking to read.

This methodology is based on:

storing the data information in the Flash cells, for example in Flash memory cells of a data area;

storing the memory address in Flash cells, for example in a first plurality of Flash memory cells in a spare area;

storing also the ECC in Flash cells, for example in a second plurality of Flash memory cells in the spare area;

comparing a content of the first Flash memory cells in the spare area with an address requested by the host to access the data stored in the Flash memory cells of the data area. In some embodiments the host sends the requested address to the memory device or component for the comparison. This method ensures the correctness of the read operation in the sense that:

The page is exactly the one addressed;

The presence of the ECC is a guarantee that data and address content is corrected according to an error correction mechanism.

The implementation of the above safety mechanism contributes to achieve the targeted ASIL level, i.e. D for the memory device 100.

FIG. 5 is schematic view of a group of address registers for a memory page in the memory component of the present disclosure. More specifically, it shows a schematic view indicating that the address bits and the ECC bits are included also in the channel or bus communication with the host or SoC device 10.

In other words, the read data buffers of the memory component 100 are completed with:

Data;

Address (stored to execute the comparison);

ECC (to ensure that Data+Address sent to the bus can be corrected in case of errors).

This solution allows improving the safety in all the communication exchanges from the memory component 100 to the associated SoC device 10.

The architecture and method of the present disclosure has at least a couple of evident advantages. First of all, the system improves the safety and correctness of the data reading between the host device and the associated memory device.

Secondly, the system automatically protected against any possible thermal drift of the environment in which the memory device or the system of the memory device is embedded.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The invention claimed is:

1. An apparatus comprising:
   a plurality of sub-arrays, wherein each sub-array is coupled to a respective bus or channel for communicating with a core of a host device or a System-on-Chip (SoC), wherein the plurality of sub-array each include:
      a respective plurality of memory blocks;
      a respective plurality of memory rows in each memory block; and
      a plurality of extended pages in each memory row; and
   a memory controller coupled to the plurality of sub-arrays, wherein the memory controller is configured to store respective data, a respective address, and a respective error correction code (ECC) that covers the respective data and the respective address in each extended page.

2. The apparatus of claim 1, wherein each extended page is independently addressable.

3. The apparatus of claim 1, wherein each of the plurality of sub-arrays includes address registers connected to data buffer registers.

4. The apparatus of claim 1, wherein:
   the respective data comprises at least 128 data bits;
   the respective address comprises at least 24 address bits;
   the respective ECC comprises at least 16 ECC bits; and
   each memory block includes at least 256 rows of memory cells and each memory row of the plurality of memory rows includes at least 16 extended pages.

5. The apparatus of claim 1, further comprising sensing circuitry configured to read one of the plurality of extended pages in a single clock cycle.

6. The apparatus of claim 1, wherein the memory controller is configured to store at least internal block variables of a reading phase and a known pattern in a dummy row of a sub-array.

7. The apparatus of claim 6, wherein the dummy row is located outside an address space of a corresponding block.

8. A method, comprising:
   storing respective data, a respective address, and a respective error correction code (ECC) that covers the respective data and the respective address in each of a plurality of extended pages in a row in a memory block in a sub-array of a memory apparatus; and
   communicating with a core of a host device or a System-on-Chip (SoC) via a direct memory access.

9. The method of claim 8, further comprising independently addressing each extended page.

10. The method of claim 8, wherein storing the respective data, the respective address, and the respective ECC comprises storing at least 168 bits.

11. The method of claim 8, wherein storing the respective data, the respective address, and the respective ECC comprises storing at least 128 data bits, at least 24 address bits, and at least 16 ECC bits.

12. The method of claim 8, further comprising reading one extended page in a single clock cycle to feed the respective bus or channel with a corresponding number of bits.

13. The method of claim 8, further comprising storing at least internal block variables of a reading phase and a known pattern in a dummy row of the sub-array.

14. The method of claim 8, further comprising driving the direct memory access without high power output buffers.

15. An apparatus, comprising:
   an array of memory cells including a spare area; and
   a memory controller coupled to the array and configured to:
      store data in the array;
      store a memory address in a first plurality of memory cells in the spare area;
      store an error correction code (ECC) in a second plurality of memory cells in the spare area; and
      compare a content of the first plurality of memory cells with an address of requested data.

16. The apparatus of claim 15, wherein the memory controller is configured to read the first plurality of memory cells in the spare area to obtain the content.

17. The apparatus of claim 15, wherein the array of memory cells comprises:
   a plurality of memory blocks at respective block locations, wherein each memory block location includes an extended page including a group of data bits, address bits, and ECC bits.

18. The apparatus of claim 17, wherein the extended page includes a string of a first group of 128 data bits, a second group of 24 address bits, and a third group of 16 ECC bits.

19. The apparatus of claim 17, wherein the extended page is independently addressable.

20. The apparatus of claim 15, wherein a System-on-Chip (SoC) device is coupled to the array of memory cells in a direct memory access configuration.

* * * * *